(12) United States Patent
Liao et al.

(10) Patent No.: US 12,300,541 B2
(45) Date of Patent: May 13, 2025

(54) STRUCTURE AND FORMATION METHOD OF SEMICONDUCTOR DEVICE WITH CARBON-CONTAINING CONDUCTIVE STRUCTURE

(71) Applicant: Taiwan Semiconductor Manufacturing Company, Ltd., Hsinchu (TW)

(72) Inventors: Wei-Hao Liao, Taichung (TW); Hsi-Wen Tien, Xinfeng Township, Hsinchu County (TW); Yu-Teng Dai, Hsinchu County (TW); Chih-Wei Lu, Hsinchu (TW); Hsin-Chieh Yao, Hsinchu (TW); Hwei-Jay Chu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 505 days.

(21) Appl. No.: 17/578,102

(22) Filed: Jan. 18, 2022

(65) Prior Publication Data
US 2023/0230881 A1 Jul. 20, 2023

(51) Int. Cl.
*H01L 21/768* (2006.01)
*H01L 23/522* (2006.01)
*H01L 23/532* (2006.01)
H01L 21/285 (2006.01)
H01L 21/311 (2006.01)

(52) U.S. Cl.
CPC .... *H01L 21/76876* (2013.01); *H01L 23/5226* (2013.01); *H01L 23/53276* (2013.01); *H01L 21/28556* (2013.01); *H01L 21/31116* (2013.01); *H01L 21/76802* (2013.01); *H01L 21/76868* (2013.01); *H01L 21/76883* (2013.01); *H01L 21/76885* (2013.01)

(58) Field of Classification Search
CPC ......... H01L 21/76897; H01L 21/76876; H01L 21/76868; H01L 21/78885; H01L 21/3116; H01L 21/28556; H01L 23/5226; H01L 23/53276; H01L 2221/1094; H01L 21/76885; H01L 21/31116; H01L 21/76883; H01L 21/76802; H01L 21/76805; H01L 21/2855
See application file for complete search history.

(56) References Cited

U.S. PATENT DOCUMENTS

| 2004/0233649 A1* | 11/2004 | Honlein | H01L 24/81 257/E21.511 |
| 2006/0249726 A1* | 11/2006 | Choi | H10K 10/481 257/9 |
| 2006/0278901 A1* | 12/2006 | Dangelo | H01L 23/373 257/E23.105 |

(Continued)

*Primary Examiner* — Khiem D Nguyen
(74) *Attorney, Agent, or Firm* — Birch, Stewart, Kolasch & Birch, LLP

(57) ABSTRACT

A semiconductor device structure and a method for forming a semiconductor device structure are provided. The semiconductor device structure includes a substrate and a conductive line over the substrate. The semiconductor device structure also includes a catalyst structure over the conductive line and a carbon-containing conductive via directly on the catalyst structure. The semiconductor device structure further includes a dielectric layer surrounding the carbon-containing conductive via.

20 Claims, 13 Drawing Sheets

(56) References Cited

U.S. PATENT DOCUMENTS

| | | | |
|---|---|---|---|
| 2008/0211101 A1* | 9/2008 | Han | B82Y 30/00 |
| | | | 438/597 |
| 2009/0045391 A1* | 2/2009 | Won | H01L 29/0665 |
| | | | 438/585 |
| 2014/0284799 A1* | 9/2014 | Katagiri | H01L 21/76834 |
| | | | 257/750 |
| 2015/0270225 A1* | 9/2015 | Yang | H01L 23/481 |
| | | | 438/618 |
| 2016/0071803 A1* | 3/2016 | Saito | H01L 21/76843 |
| | | | 257/746 |
| 2018/0233406 A1* | 8/2018 | Yeh | H01L 21/32135 |

* cited by examiner

STRUCTURE AND FORMATION METHOD OF SEMICONDUCTOR DEVICE WITH CARBON-CONTAINING CONDUCTIVE STRUCTURE

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
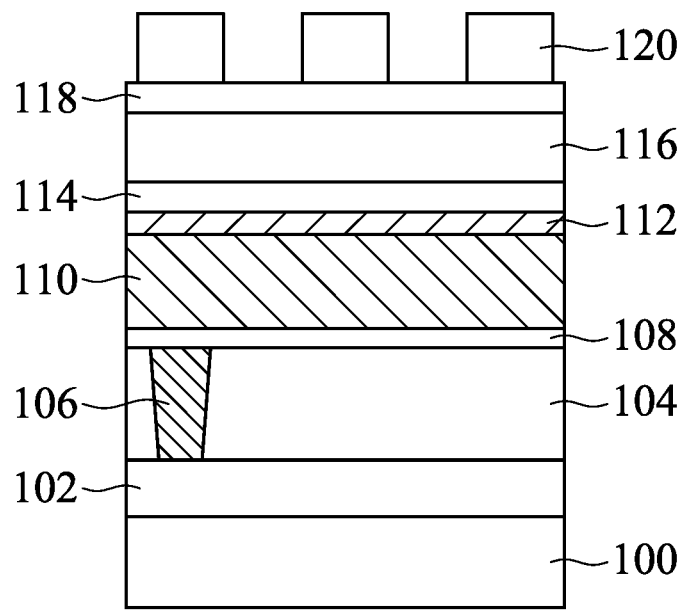
FIGS. 1A-1L are cross-sectional views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10° in some embodiments. The word "substantially" does not exclude "completely" e.g. a composition which is "substantially free" from Y may be completely free from Y in some embodiments.

Terms such as "about" in conjunction with a specific distance or size are to be interpreted so as not to exclude insignificant deviation from the specified distance or size and may include for example deviations of up to 10% in some embodiments. The term "about" in relation to a numerical value x may mean x±5 or 10% in some embodiments.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1L are cross-sectional views of various stages of a process for forming a portion of a semiconductor device structure, in accordance with some embodiments. As shown in FIG. 1A, a substrate 100 is received or provided. In some embodiments, the substrate 100 is a semiconductor substrate. In some embodiments, the substrate 100 is a bulk semiconductor substrate, such as a semiconductor wafer. The substrate 100 may include silicon or other elementary semiconductor materials such as germanium. The substrate 100 may be un-doped or doped (e.g., p-type, n-type, or a combination thereof). In some embodiments, the substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the substrate 100 includes a multi-layered structure. For example, the substrate 100 includes a silicon-germanium layer formed on a bulk silicon layer.

In some embodiments, isolation features (not shown) are formed in the substrate 100 to define and isolate various device elements (not shown) formed in the substrate 100. The isolation features include, for example, trench isolation (STI) features or local oxidation of silicon (LOCOS) features.

In some embodiments, various device elements are formed in and/or on the substrate 100. Examples of the various device elements that may be formed in the substrate 100 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, one or more other suitable elements, or a combination thereof. Various processes are performed to form the various device elements, such as deposition, etching, implantation, photolithography, annealing, planarization, one or more other applicable processes, or a combination thereof.

In some embodiments, an interconnect structure 102 is formed over the substrate 100, as shown in FIG. 1A. The interconnect structure 102 may include one or more dielectric layers and multiple conductive features. The dielectric layers may be made of or include carbon-containing silicon oxide, silicon oxide, borosilicate glass (BSG), phosphoric silicate glass (PSG), borophosphosilicate glass (BPSG), fluorinated silicate glass (FSG), porous dielectric material, one or more other suitable low-k dielectric materials, one or more other suitable materials, or a combination thereof.

In some embodiments, the interconnect structure 102 includes multiple conductive features formed between the dielectric layers. The conductive features may include conductive contacts, conductive lines, and/or conductive vias. The formation of the interconnect structure 102 may involve multiple deposition processes, patterning processes, etching processes, and planarization processes. The device elements in and/or on the substrate 100 will be interconnected through the interconnection structure to be formed over the substrate 100.

As shown in FIG. 1A, a dielectric layer 104 is deposited over the interconnect structure 102, in accordance with some embodiments. Similar to the dielectric layers of the interconnect structure 102, the dielectric layer 104 may be made of or include carbon-containing silicon oxide, silicon oxide, borosilicate glass (BSG), phosphoric silicate glass (PSG), borophosphosilicate glass (BPSG), fluorinated silicate glass (FSG), porous dielectric material, one or more other suitable low-k dielectric materials, one or more other suitable materials, or a combination thereof. The dielectric layer 104 may be deposited using an atomic layer deposition (ALD) process, a flowable chemical vapor deposition (FCVD) process, a chemical vapor deposition (CVD) process, one or more other applicable processes, or a combination thereof.

As shown in FIG. 1A, a conductive via 106 is formed over the interconnect structure 102, in accordance with some embodiments. In some embodiments, the conductive via 106 is electrically connected to one of the conductive features of the interconnect structure 102. In some embodiments, the conductive via 106 is surrounded by the dielectric layer 104, as shown in FIG. 1A. The conductive via 106 may be made of or include copper, aluminum, gold, titanium, platinum, cobalt, tungsten, tantalum, an alloy thereof, one or more other suitable materials, or a combination thereof.

The formation of the conductive via 106 may involve a CVD process, an ALD process, a physical vapor deposition (PVD) process, an electroplating process, an electroless plating process, one or more other applicable processes, or a combination thereof. The formation of the conductive via 106 may further involve a planarization process. The planarization process may include a chemical mechanical polishing (CMP) process, a grinding process, an etching process, a dry polishing process, one or more other applicable processes, or a combination thereof. In some embodiments, the conductive via 106 is formed after the formation of the dielectric layer 104. For example, a single damascene process may be used to form the conductive via 106. In some other embodiments, the conductive via 106 is formed before the formation of the dielectric layer 106. For example, a conductive layer is patterned to form the conductive via 106. Afterwards, the conductive via 106 is covered by the dielectric layer 104. A planarization process is then used to provide the conductive via 106 and the dielectric layer 104 with substantially coplanar top surfaces.

Afterwards, a glue layer 108 is deposited over the conductive via 106 and the dielectric layer 104, as shown in FIG. 1A in accordance with some embodiments. The glue layer 108 may be made of or include TaN, Ta, TiN, Ti, one or more other suitable materials, or a combination thereof. The glue layer 108 may be deposited using a CVD process, an ALD process, a PVD process, one or more other applicable processes, or a combination thereof.

As shown in FIG. 1A, a conductive layer 110 is deposited over the glue layer 108, in accordance with some embodiments. The thickness of the conductive layer 110 may be in a range from about 200 Å to about 500 Å. The conductive layer 110 may be made of or include copper, aluminum, gold, platinum, tungsten, tantalum, ruthenium, molybdenum, iridium, palladium, silver, chromium, an alloy thereof, one or more other suitable materials, or a combination thereof. The conductive layer 110 may be deposited using a PVD process, a CVD process, an ALD process, an electroplating process, an electroless plating process, one or more other applicable processes, or a combination thereof. The deposition temperature of the conductive layer 110 may be in a range from about 10 degrees C. to about 400 degrees C.

As shown in FIG. 1A, a catalyst layer 112 is deposited over the conductive layer 110, in accordance with some embodiments. The catalyst layer 112 is used to facilitate a subsequent formation of a carbon-containing conductive material. In some embodiments, the catalyst layer 112 is in direct contact with the conductive layer 110. The thickness of the catalyst layer 112 may be in a range from about 5 Å to about 15 Å.

In some embodiments, the catalyst layer 112 and the conductive layer 110 are made of different materials. The catalyst layer 112 may be a metal-containing layer. The catalyst layer 112 may be made of or include titanium, iron, cobalt, nickel, one or more other suitable materials, or a combination thereof. Alternatively, the catalyst layer 112 may be a metal-containing oxide layer. For example, the catalyst layer 112 may be made of or include iron oxide, titanium oxide, one or more other suitable materials, or a combination thereof.

The catalyst layer 112 may be deposited on the conductive layer 110 using an ALD process, a PVD process, a CVD process, an electroplating process, an electroless plating process, one or more other applicable processes, or a combination thereof. The deposition temperature of the catalyst layer 112 may be in a range from about 10 degrees C. to about 400 degrees C.

Many variations and/or modifications can be made to embodiments of the disclosure. In some embodiments, the conductive layer 110 is made of or includes titanium, iron, cobalt, nickel, one or more other suitable materials, or a combination thereof. In these cases, the upper portion of the conductive layer 110 may also function as a catalyst layer. In some embodiments, the catalyst layer 112 is not formed since the upper portion of the conductive layer 110 may function as a catalyst layer.

Afterwards, a hard mask layer 114 is deposited over the catalyst layer 112, as shown in FIG. 1A in accordance with some embodiments. The hard mask layer 114 may be made of or include silicon, silicon oxide, silicon carbide, silicon nitride, carbon-containing silicon nitride, carbon-containing silicon oxide, one or more other suitable materials, or a combination thereof. The etch selectivity between the catalyst layer 112 and the hard mask layer 114 may be greater than about 10. The hard mask layer 114 may be deposited using a CVD process, an ALD process, one or more applicable processes, or a combination thereof. The deposition temperature of the hard mask layer 114 may be in a range from about 10 degrees C. to about 400 degrees C.

As shown in FIG. 1A, a bottom layer 116 and a middle layer 118 are sequentially deposited over the hard mask layer 114, in accordance with some embodiments. The bottom layer 116 may be a carbon-containing layer such as a polymer-containing layer. The middle layer 118 may be an oxide layer. Afterwards, a patterned photoresist layer 120 is formed over the middle layer 118, as shown in FIG. 1A in accordance with some embodiments. The patterned photoresist layer 120, the middle layer 118, and the bottom layer 116 may together be used to assist in the subsequent patterning of the hard mask layer 114.

Figure 1B:
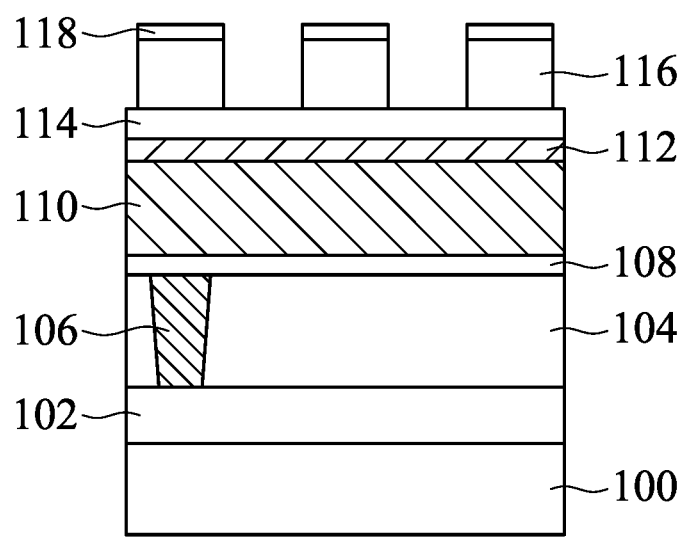

As shown in FIG. 1B, with the patterned photoresist layer 120 as an etching mask, the middle layer 118 and the bottom layer 116 are partially removed, in accordance with some embodiments. As a result, the pattern of the patterned photoresist layer 120 is transferred to the middle layer 118 and the bottom layer 116. One or more etching processes may be used to pattern the middle layer 118 and the bottom layer 116. The patterned photoresist layer 120 may be consumed during the etching process of the middle layer 118 and the bottom layer 116. Alternatively, one or more additional processes are used to remove the remaining portions of the patterned photoresist layer 120 after the patterning of the middle layer 118 and the bottom layer 116.

Figure 1C:
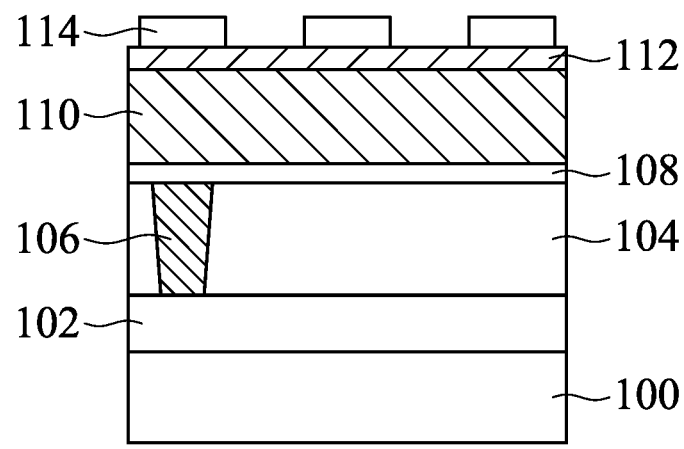

As shown in FIG. 1C, with the middle layer 118 and the bottom layer 116 as an etching mask, the hard mask layer 114 is partially removed, in accordance with some embodiments. As a result, the pattern of the middle layer 118 and the bottom layer 116 is transferred to the hard mask layer 114. One or more etching processes may be used to pattern the hard mask layer 114. The middle layer 118 and the bottom layer 116 may be consumed during the etching process of the hard mask layer 114. Alternatively, one or more additional processes are used to remove the remaining portions of the middle layer 118 and the bottom layer 116 after the patterning of the hard mask layer 114.

Figure 1D:
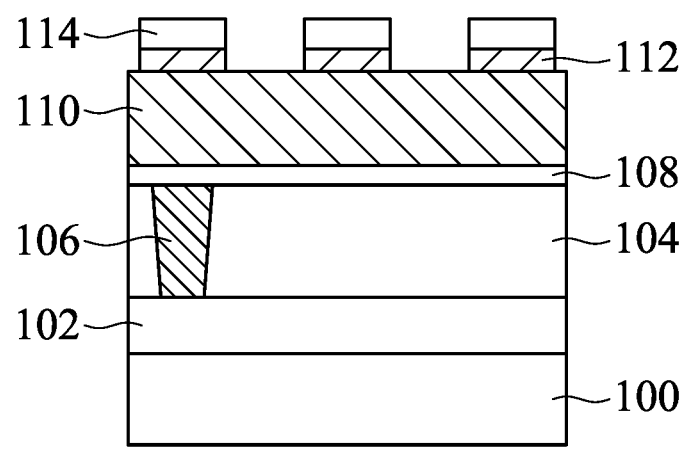

As shown in FIG. 1D, with the hard mask layer 114 as an etching mask, the catalyst layer 112 is partially removed, in accordance with some embodiments. As a result, the pattern of the hard mask layer 114 is transferred to the catalyst layer 112. One or more etching processes may be used to pattern the catalyst layer 112. In some embodiments, the catalyst layer 112 is partially removed using a dry etching process.

The etchant gas used in the dry etching process may include $Cl_2$, $SiCl_4$, $BCl_3$, $CF_4$, $CHF_3$, $CH_3F$, $CH_2F_2$, $C_4F_8$, $C_4F_6$, $N_2$, $O_2$, $H_2$, HBr, He, Ar, one or more other suitable gases, or a combination thereof. The transformer coupled plasma (TCP) power used in the dry etching process may be in a range from about 100 W to about 2000 W. The bias voltage used in the dry etching process may be in a range from about 0 V to about 800 V.

Figure 1E:
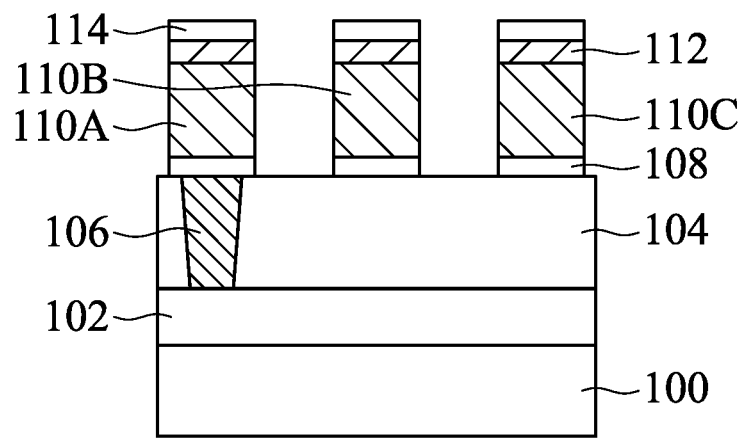

As shown in FIG. 1E, with the hard mask layer 114 and the catalyst layer 112 as an etching mask, the conductive layer 110 and the glue layer 108 are partially removed, in accordance with some embodiments. As a result, the pattern of the hard mask layer 114 and the catalyst layer 112 is transferred to the conductive layer 110 and the glue layer 108. As a result, the remaining portions of the conductive layer 110 form conductive structures 110A, 110B, and 110C, as shown in FIG. 1E. In some embodiments, the conductive structures 110A, 110B, and 110C function as conductive lines.

One or more etching processes may be used to pattern the conductive layer 110 and the glue layer 108. In some embodiments, the conductive layer 110 and the glue layer 108 are partially removed using a dry etching process. The etchant gas used in the dry etching process may include $Cl_2$, $SiCl_4$, $BCl_3$, $CF_4$, $CHF_3$, $CH_3F$, $CH_2F_2$, $C_4F_8$, $C_4F_6$, $N_2$, $O_2$, $H_2$, HBr, He, Ar, one or more other suitable gases, or a combination thereof. The TCP power used in the dry etching process may be in a range from about 100 W to about 2000 W. The bias voltage used in the dry etching process may be in a range from about 0 V to about 800 V.

Figure 1F:
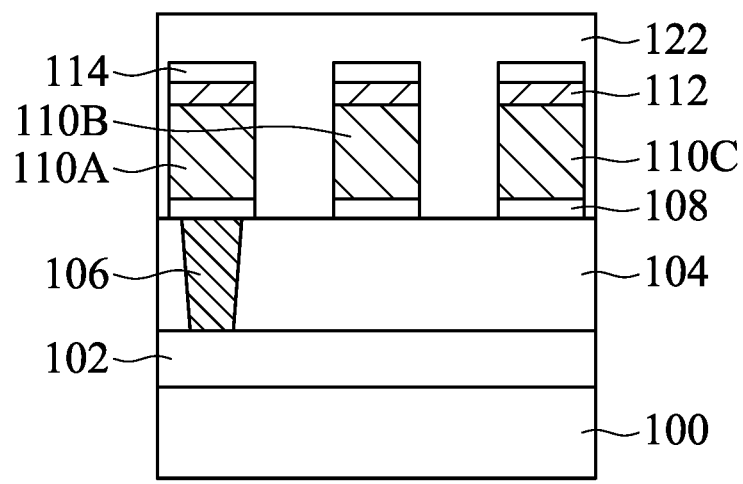

As shown in FIG. 1F, a dielectric layer 122 is deposited over the structure shown in FIG. 1E to fill the gaps between the conductive structures 110A, 110B, and 110C, in accordance with some embodiments. In some embodiments, the dielectric layer 122 overfills the gaps and covers the hard mask layer 114. The dielectric layer 122 laterally surrounds the conductive structures 110A, 110B, and 110C, as shown in FIG. 1F.

The dielectric layer 122 may be made of or include a low-k dielectric material. The dielectric layer 122 may be made of or include carbon-containing silicon oxide, fluorinated silicate glass (FSG), borosilicate glass (BSG), phosphoric silicate glass (PSG), borophosphosilicate glass (BPSG), silicon oxide, silicon oxynitride, one or more other suitable materials, or a combination thereof. The dielectric layer 122 may be deposited using an ALD process, an FCVD process, a CVD process, one or more other applicable processes, or a combination thereof.

In some embodiments, since the dielectric layer 122 is formed after the formation of the conductive structures 110A, 110B, and 110C, there is no etching-related process (such as a single damascene process or a dual damascene process) applied to the dielectric layer 122. The quality and reliability of the dielectric layer 122 is therefore ensured. The risk of the time dependent dielectric breakdown (TDDB) of the dielectric layer 122 is significantly reduced.

Figure 1G:
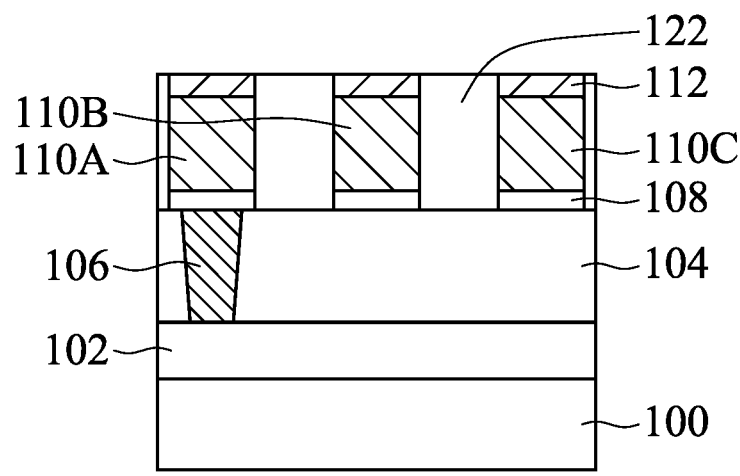

As shown in FIG. 1G, a planarization process is used to remove the hard mask layer 114, in accordance with some embodiments. During the planarization process, the dielectric layer 122 is partially removed. As a result, the catalyst layer 112 is exposed. The catalyst layer 112 may function as catalyst structures to assist in the subsequent formation of the carbon-containing conductive material thereon. In some embodiments, the top surfaces of the catalyst layer 112 and the remaining portions of the dielectric layer 122 are substantially level with each other. The planarization process may include a CMP process, a grinding process, an etching process, a dry polishing process, one or more other applicable processes, or a combination thereof.

Figure 1H:
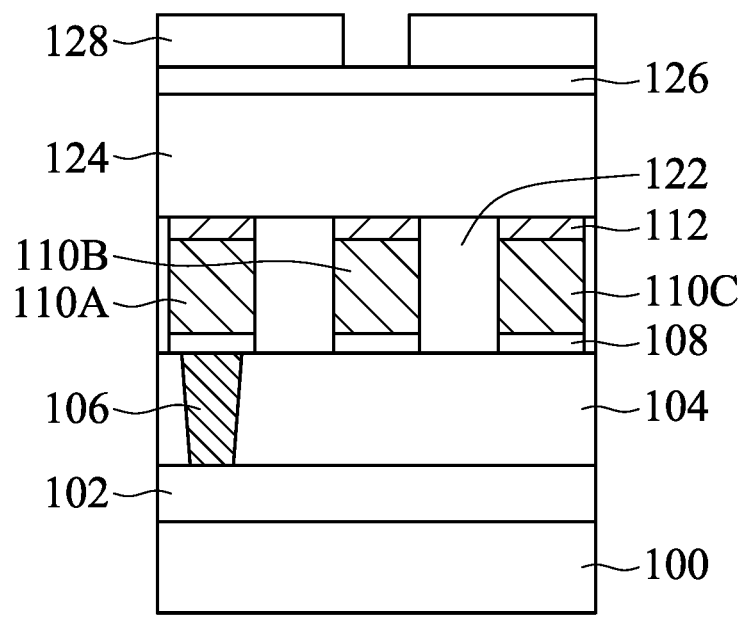

As shown in FIG. 1H, a dielectric layer 124 is deposited over the structure shown in FIG. 1G, in accordance with some embodiments. The dielectric layer 124 may be made of or include carbon-containing silicon oxide, fluorinated silicate glass (FSG), borosilicate glass (BSG), phosphoric silicate glass (PSG), borophosphosilicate glass (BPSG), silicon oxide, silicon oxynitride, one or more other suitable materials, or a combination thereof. The dielectric layer 142 may be deposited using a CVD process, an ALD process, an FCVD process, one or more other applicable processes, or a combination thereof.

In some embodiments, the materials of the dielectric layer 124 and the dielectric layer 122 are not identical. In some embodiments, the dielectric layer 124 has a greater atomic concentration of carbon than that of the dielectric layer 122. The atomic concentration of carbon in the dielectric layer 124 may be in a range from about 20% to about 30%. The atomic concentration of carbon in the dielectric layer 122 may be in a range from about 0% to about 10%. The atomic concentration of silicon in the dielectric layer 124 may be in a range from about 50% to about 60%. The atomic concentration of silicon in the dielectric layer 122 may be in a range from about 50% to about 60%. The atomic concentration of oxygen in the dielectric layer 124 may be in a range from about 20% to about 30%. The atomic concentration of oxygen in the dielectric layer 122 may be in a range from about 30% to about 40%. In some embodiments, due to the composition difference between the dielectric layers 122 and 124, an etching selectivity between the dielectric layer 122 and the dielectric layer 124 may be greater than about 8.

However, embodiments of the disclosure are not limited thereto. In some other embodiments, the material and formation method of the dielectric layer 124 are the same as or similar to those of the dielectric layer 122.

Afterwards, an anti-reflection layer 126 and a patterned photoresist layer 128 are sequentially formed over the dielectric layer 124, as shown in FIG. 1H in accordance with some embodiments. The patterned photoresist layer 128 has an opening that defines the shape and position of a via hole that will be formed in the dielectric layer 124.

Figure 1I:
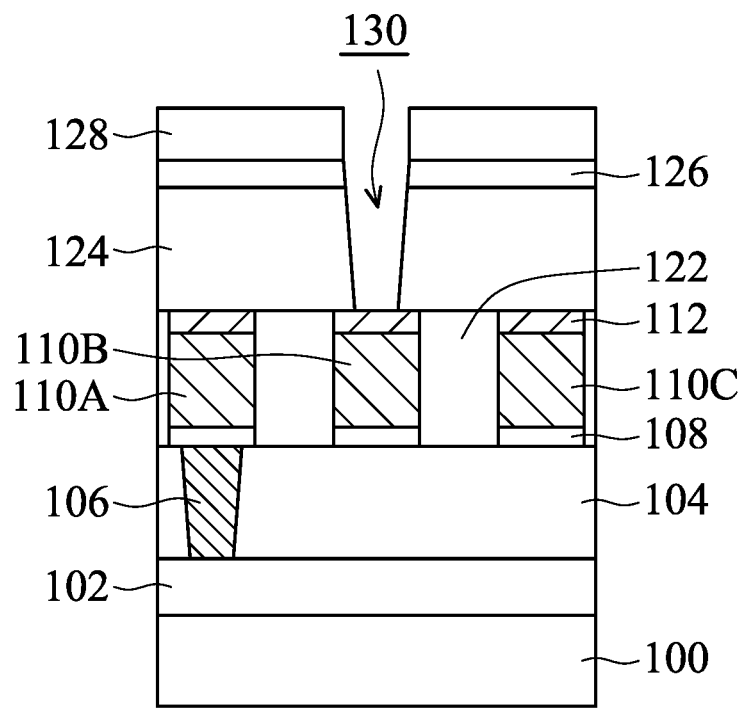

As shown in FIG. 1I, with the patterned photoresist layer 128 as an etching mask, the dielectric layer 124 and the anti-reflection layer 126 are partially removed, in accordance with some embodiments. As a result, the pattern of the patterned photoresist layer 128 is transferred to the dielectric layer 124. As a result, a via hole 130 is formed. In some embodiments, the via hole 130 partially exposes the catalyst layer 112. In some embodiments, after the formation of the via hole 130, the patterned photoresist layer 128 is removed.

One or more etching processes may be used to partially remove the dielectric layer 124. In some embodiments, the dielectric layer 124 is partially removed using a dry etching process. The etchant gas used in the dry etching process may include $CF_4$, $CHF_3$, $CH_3F$, $CH_2F_2$, $C_4F_8$, $C_4F_6$, $N_2$, $O_2$, $H_2$, HBr, He, Ar, one or more other suitable gases, or a combination thereof. The TCP power used in the dry etching process may be in a range from about 100 W to about 2000 W. The bias voltage used in the dry etching process may be in a range from about 0 V to about 800 V.

Figure 1J:
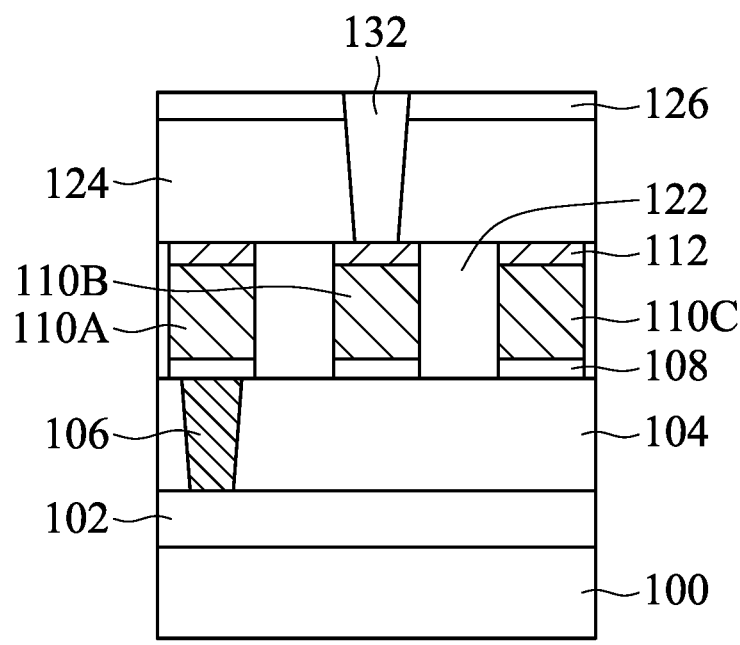

As shown in FIG. 1J, a carbon-containing conductive structure 132 is formed on the catalyst layer 112 exposed by the via hole 130, in accordance with some embodiments. In some embodiments, the carbon-containing conductive structure 132 completely fills the via hole 130. In some embodiments, the carbon-containing conductive structure 132 is physically separated from the conductive structure 110B. The carbon-containing conductive structure 132 may function as a conductive via that forms electrical connection between a underlying conductive line and an overlying conductive line.

The catalyst layer 112 may facilitate the growth of the carbon-containing conductive structure 132. In some embodiments, the carbon-containing conductive structure 132 has a higher electrical conductivity than that of copper. In some embodiments, the carbon-containing conductive structure 132 has a higher thermal conductivity than that of copper. In some embodiments, the carbon-containing conductive structure 132 has a good thermal stability.

The carbon-containing conductive structure 132 may be made of or include carbon nanotube, graphene, carbon nanotube-containing material, graphene-containing material, one or more other suitable carbon-containing materials, or a combination thereof. In some embodiments, the carbon-containing conductive structure 132 has a greater atomic concentration of carbon than that of the conductive structure 110B. In some embodiments, the conductive structure 110B is substantially free of carbon. In some other embodiments, the conductive structure 110B has a trace amount of carbon (such as carbon impurities).

The carbon-containing conductive structure 132 may be formed using a CVD process (such as a plasma-enhanced CVD process), an ALD process, one or more other applicable processes, or a combination thereof. In some embodiments, the carbon-containing conductive structure 132 is formed using a PECVD process. The reaction gas used for forming the carbon-containing conductive structure 132 may include $C_6H_6$, $CH_4$, one or more other suitable gases, or a combination thereof. The gas mixture used for forming the carbon-containing conductive structure 132 may further include He, Ar, one or more other suitable gases, or a combination thereof. The operation pressure of the PECVD process may be in a range from about 10 mtorr to about 100 mtorr. The operation power of the PECVD process may be in a range from about 100 W to about 500 W.

Figure 1K:
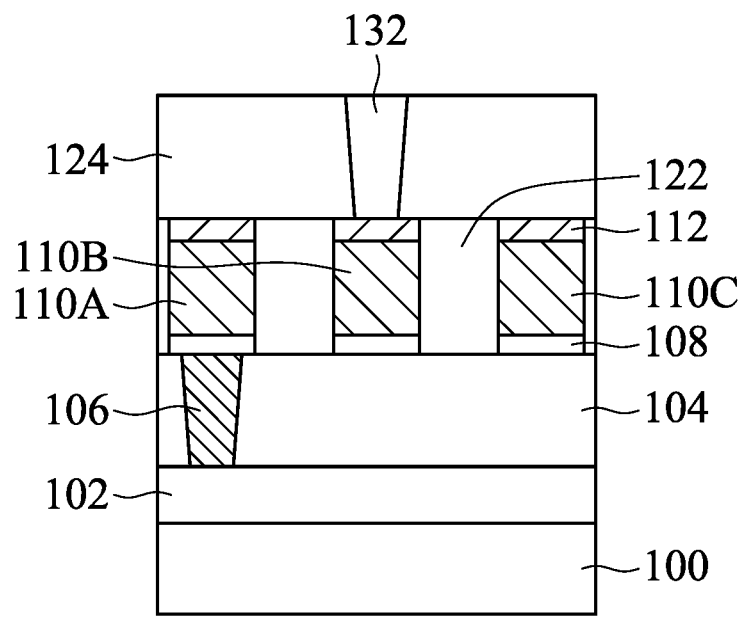

As shown in FIG. 1K, a planarization process is used to remove the anti-reflection layer 126, in accordance with some embodiments. During the planarization process, the carbon-containing conductive structure 132 is partially removed. As a result, the dielectric layer 124 is exposed. In some embodiments, the top surfaces of the dielectric layer 124 and the remaining portion of the carbon-containing conductive structure 132 are substantially level with each other. The planarization process may include a CMP process, a grinding process, an etching process, a dry polishing process, one or more other applicable processes, or a combination thereof.

Figure 1L:
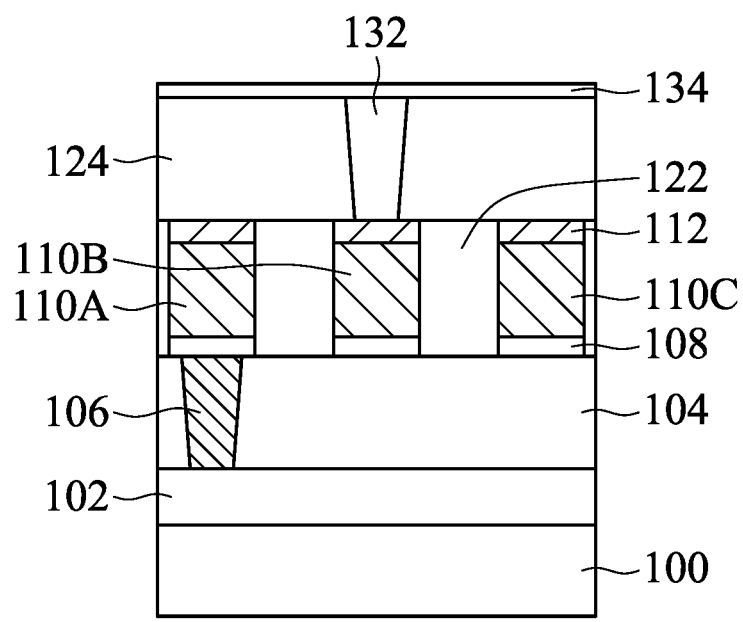

As shown in FIG. 1L, an etch stop layer 134 is deposited over the dielectric layer 124 and the carbon-containing conductive structure 132, in accordance with some embodiments. The etch stop layer 134 may be made of or include silicon nitride, silicon oxynitride, silicon carbide, carbon-containing silicon nitride, carbon-containing silicon oxynitride, one or more other suitable materials, or a combination thereof. The etch stop layer 134 may be deposited using a CVD process, an ALD process, one or more other applicable processes, or a combination thereof. After the formation of the etch stop layer 134, more dielectric layers and more conductive structures that include, for example, some carbon-containing conductive structures may be formed over the etch stop layer 134.

Figure 2A:
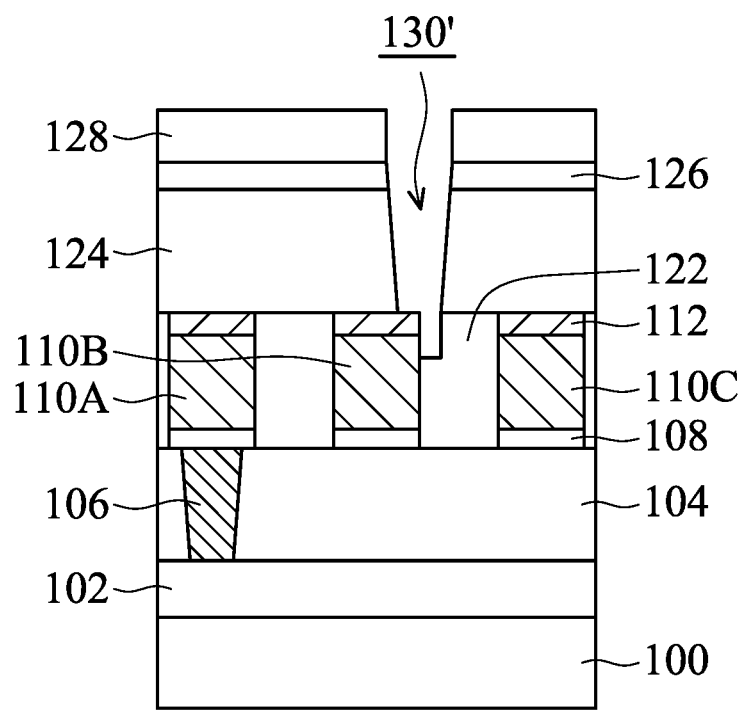
FIGS. 2A-2C are cross-sectional views of various stages of a process for forming a portion of a semiconductor device structure, in accordance with some embodiments.
Figure 2B:
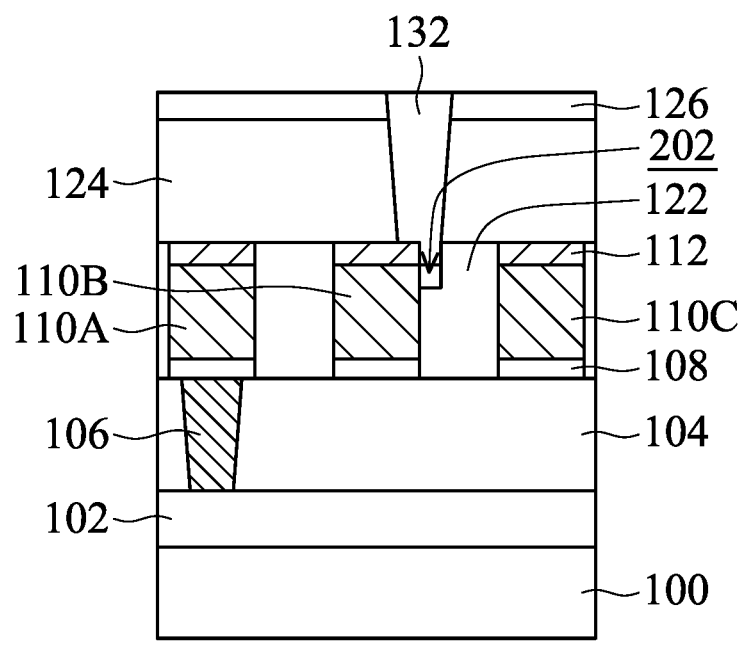
Figure 2C:
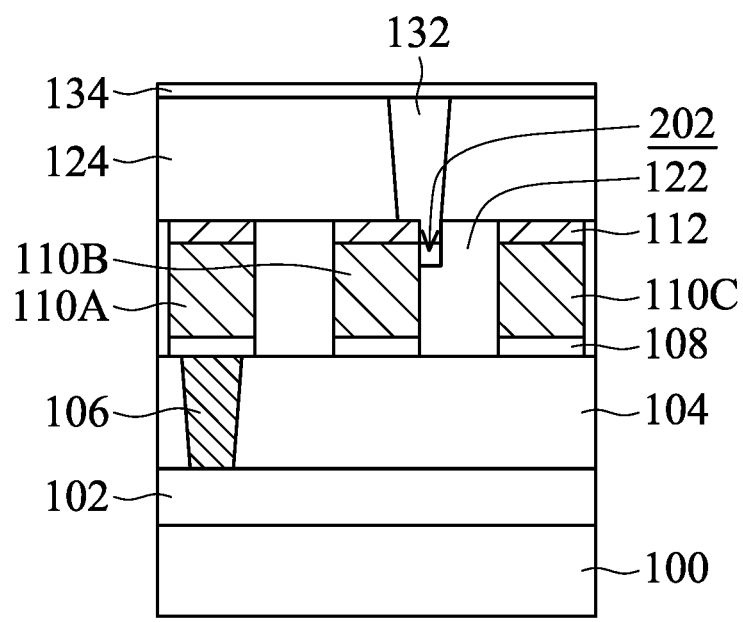

Many variations and/or modifications can be made to embodiments of the disclosure. FIGS. 2A-2C are cross-sectional views of various stages of a process for forming a portion of a semiconductor device structure, in accordance with some embodiments.

In some embodiments, an overlay shift might occur during the formation of the via hole. As shown in FIG. 2A, similar to the via hole 130 illustrated in FIG. 1I, a via hole 130' is formed, in accordance with some embodiments. Due to the overlay shift, the via hole 130' exposes side surfaces of the catalyst layer 112 and the conductive structure 110B, as shown in FIG. 2A. The via hole 130' further exposes the dielectric layer 122.

As shown in FIG. 2B, similar to the carbon-containing conductive structure 132 illustrated in FIG. 1J, a carbon-containing conductive structure 132 is grown on the exposed surfaces of the catalyst layer 112, in accordance with some embodiments. As shown in FIG. 2B, both the top surface and the side surface of the catalyst layer 112 exposed by the via hole 130' are grown with the carbon-containing conductive structure 132. In some embodiments, the carbon-containing conductive structure 132 is directly on the top surface and the side surface of the catalyst layer 112. In some embodiments, the carbon-containing conductive structure 132 is substantially not grown on the side surface of the conductive structure 110B, as shown in FIG. 2B. The carbon-containing conductive structure 132 is grown on the catalyst layer 112 in a self-aligned manner.

In some embodiments, there is an enclosed hole 202 formed between the carbon-containing conductive structure 132 and the conductive structure 110B, as shown in FIG. 2B. In some embodiments, the enclosed hole 202 is surrounded by the carbon-containing conductive structure 132, the conductive structure 110B, and the dielectric layer 122.

In some embodiments, due to the overlay shift of the via hole 130', the portion of the dielectric layer 122 near the enclosed hole 202 may be slightly damaged by the etchant used for forming the via hole 130'. Since the carbon-containing conductive structure 132 is grown on the catalyst layer 112 in a self-aligned manner, the enclosed hole 202 may thus prevent ions from the conductive structure 110B from entering the portion of the dielectric layer 122 near the enclosed hole 202. In some embodiments, the carbon-containing conductive structure 132 itself also has no ions to enter the portion of the dielectric layer 122 near the enclosed hole 202. Therefore, short circuiting between the conductive structures 110B and 110C is prevented or reduced.

Afterwards, the processes similar to those illustrated in FIGS. 1K-1L are performed. As a result, the structure shown in FIG. 2C is formed. After the formation of the etch stop layer 134, more dielectric layers and more conductive structures that include, for example, some carbon-containing conductive structures may be formed over the etch stop layer 134.

In some embodiments, the bottommost surface of the carbon-containing conductive structure 132 is a substantially planar surface, as shown in FIG. 2C. In some embodiments, the bottommost surface of the carbon-containing conductive structure 132 is substantially level with the bottom surface of the catalyst layer 112.

Figure 3:
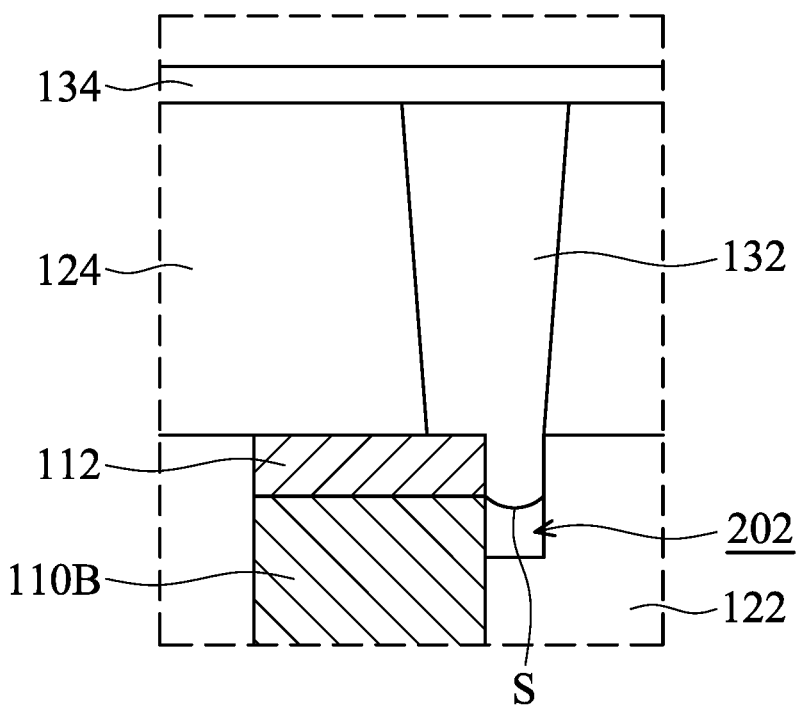
FIG. 3 is a cross-sectional view of a portion of a semiconductor device structure, in accordance with some embodiments.

However, embodiments of the disclosure are not limited thereto. Many variations and/or modifications can be made to embodiments of the disclosure. FIG. 3 is a cross-sectional view of a portion of a semiconductor device structure, in accordance with some embodiments.

In some embodiments, the bottommost surface of the carbon-containing conductive structure 132 is curved surface, as shown in FIG. 3. In some embodiments, the carbon-containing conductive structure 132 has a curved surface S. In some embodiments, the curved surface S is a convex surface that faces the enclosed hole 202, as shown in FIG. 3. In some embodiments, the bottommost surface of the carbon-containing conductive structure 132 is closer to the substrate 100 below the dielectric layer 122 than the topmost surface of the catalyst layer 112.

Many variations and/or modifications can be made to embodiments of the disclosure. In some embodiments, the growth of the carbon-containing conductive structure 132 results in the profile change and/or thickness change of the catalyst layer 112. The deposition conditions and/or the material of the catalyst layer 112 may result in different profile change and/or thickness change of the catalyst layer 112.

Figure 4:
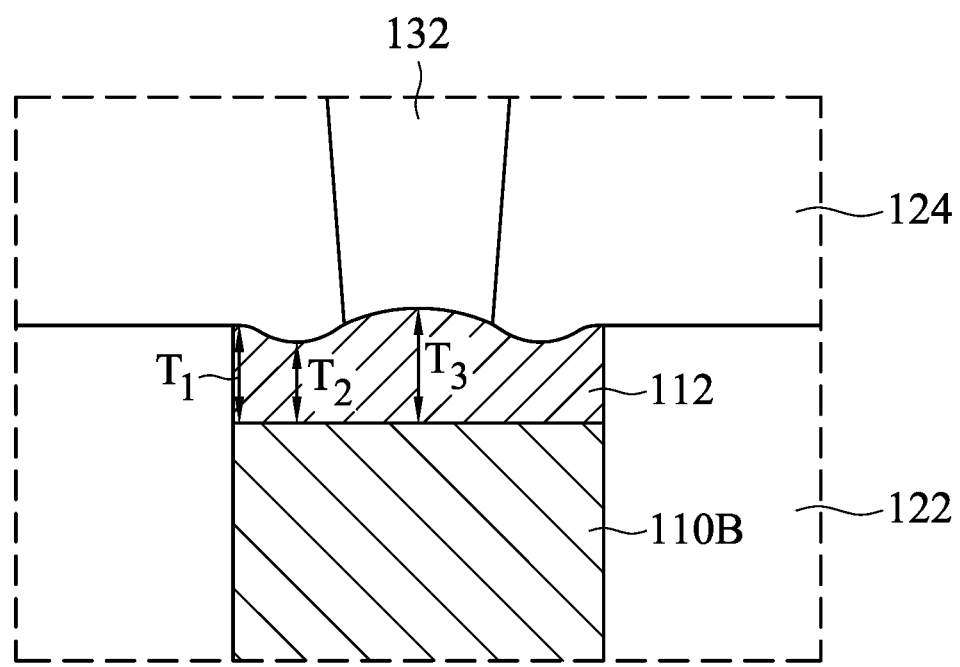
FIG. 4 is a cross-sectional view of a portion of a semiconductor device structure, in accordance with some embodiments.

FIG. 4 is a cross-sectional view of a portion of a semiconductor device structure, in accordance with some embodiments. In some embodiments, after the formation of the carbon-containing conductive structure 132, the profile and/or thickness of the catalyst layer 112 are changed. In some embodiments, the catalyst layer 112 has a first region with a thickness $T_3$ and a second region with a thickness $T_2$, as shown in FIG. 4. The carbon-containing conductive structure 132 is formed on the first region, and the second region is beside the first region. In some embodiments, the first region with the thickness $T_3$ is thicker than the second region with the thickness $T_2$.

In some embodiments, the catalyst layer 112 has a third region with a thickness $T_1$, as shown in FIG. 4. The second region is between the first region and the third region. In some embodiments, the third region with the thickness $T_1$ is thicker than the second region with the thickness $T_2$. In some embodiments, the first region with the thickness $T_3$ is thicker than the third region with the thickness $T_1$.

Figure 5:
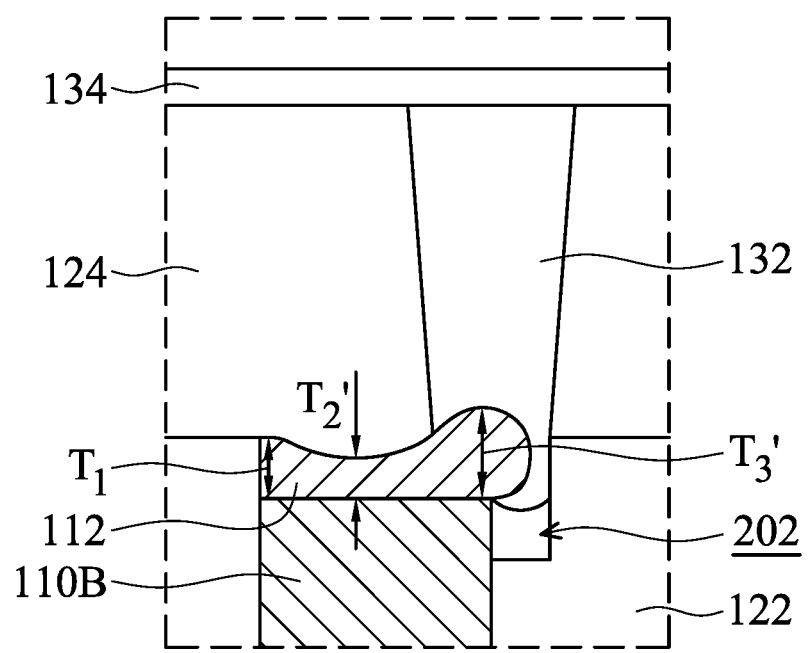
FIG. 5 is a cross-sectional view of a portion of a semiconductor device structure, in accordance with some embodiments.

FIG. 5 is a cross-sectional view of a portion of a semiconductor device structure, in accordance with some embodiments. In some embodiments, after the formation of the carbon-containing conductive structure 132, the profile and/or thickness of the catalyst layer 112 are changed. In some embodiments, the catalyst layer 112 has a first region with a thickness $T_3'$ and a second region with a thickness $T_2'$, as shown in FIG. 5. The carbon-containing conductive structure 132 is formed on the first region, and the second region is beside the first region. In some embodiments, the first region with the thickness $T_3'$ is thicker than the second region with the thickness $T_2'$.

In some embodiments, the catalyst layer 112 has a third region with a thickness $T_1$, as shown in FIG. 5. The second region is between the first region and the third region. In some embodiments, the third region with the thickness $T_1$ is thicker than the second region with the thickness $T_2'$. In some embodiments, the first region with the thickness $T_3'$ is thicker than the third region with the thickness $T_1$.

Many variations and/or modifications can be made to embodiments of the disclosure. In some embodiments, the growth of the carbon-containing conductive structure 132 cause that portions of the catalyst layer 112 are pushed away (or separated) from the main portion of the catalyst layer 112. As a result, the profile and/or thickness of the catalyst layer 112 may be changed after the formation of the carbon-containing conductive structure 132. The deposition conditions, the material of the catalyst layer 112, and/or the adhesion between the catalyst layer 112 and the conductive structure 110B may result in different profile change and/or thickness change of the catalyst layer 112.

Figure 6A:
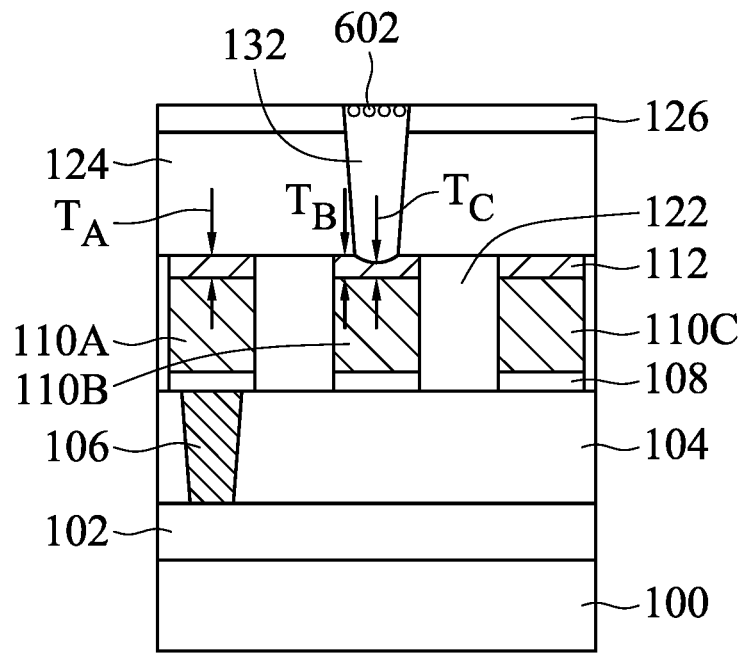
FIGS. 6A-6B are cross-sectional views of various stages of a process for forming a portion of a semiconductor device structure, in accordance with some embodiments.
Figure 6B:
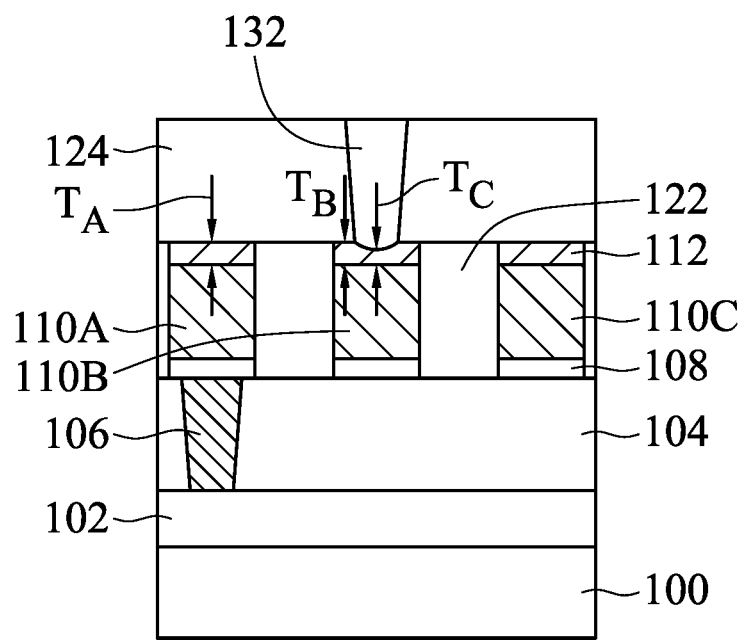

FIGS. 6A-6B are cross-sectional views of various stages of a process for forming a portion of a semiconductor device structure, in accordance with some embodiments. Similar to the embodiments illustrated in FIG. 1J, the carbon-containing conductive structure 132 is formed, as shown in FIG. 6A. In some embodiments, portions of the catalyst layer 112 are separated from the main portion of the catalyst layer 112, as shown in FIG. 6A. As a result, a first region of the catalyst layer 112 directly below the carbon-containing conductive structure 132 becomes thinner. In some embodiments, the portions of the catalyst layer 112 separated from the main portion of the catalyst layer 112 form multiple particles 602 near or at the top of the carbon-containing conductive structure 132, as shown in FIG. 6A. The material of the particles 602 may be the same as the material of the catalyst layer 112.

In some embodiments, the catalyst layer 112 has the first region with a thickness $T_C$ and a second region with a thickness $T_B$, as shown in FIG. 6A. The second region is beside the first region. In some embodiments, the first region with the thickness $T_C$ is thinner than the second region with the thickness $T_B$, as shown in FIG. 6A.

In some embodiments, the catalyst layer 112 has a third region with a thickness $T_A$, as shown in FIG. 6A. The second region is between the first region and the third region. The third region is above the conductive structure 110A. In some embodiments, the third region with the thickness $T_A$ is substantially as thick as the second region with the thickness $T_B$. In some embodiments, the first region with the thickness $T_C$ is thinner than the third region with the thickness $T_A$.

Afterwards, the processes similar to those illustrated in FIG. 1K are performed. As a result, the structure shown in FIG. 6B is formed, in accordance with some embodiments. Due to the planarization process, the particles 602 and the anti-reflection layer 126 are removed.

Figure 7A:
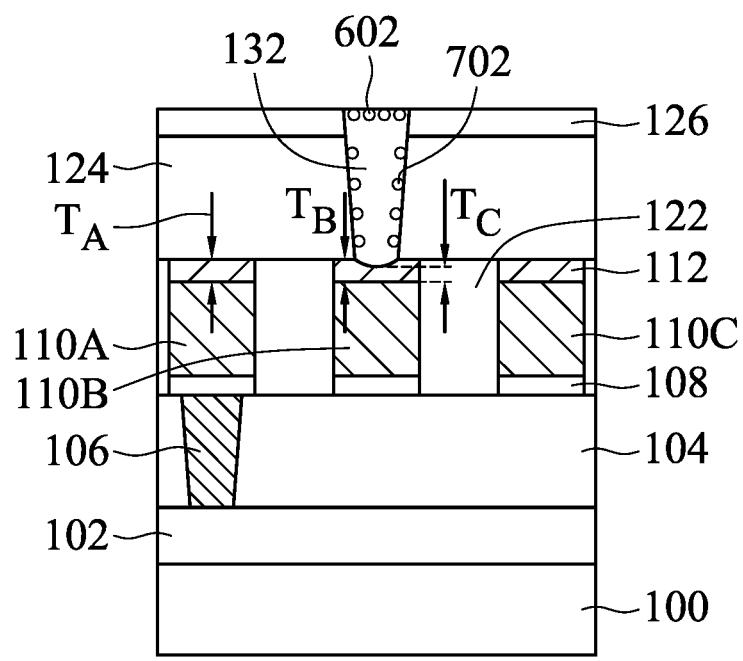
FIGS. 7A-7B are cross-sectional views of various stages of a process for forming a portion of a semiconductor device structure, in accordance with some embodiments.
Figure 7B:
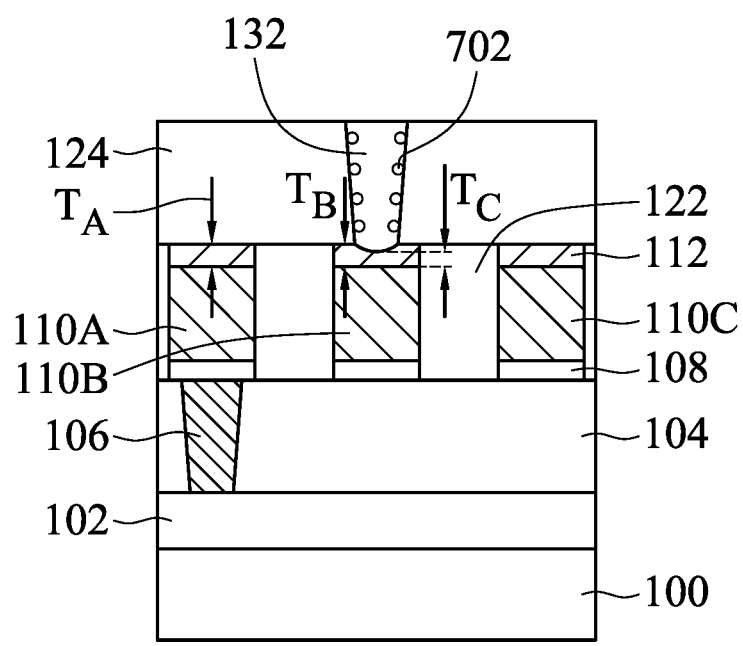

Many variations and/or modifications can be made to embodiments of the disclosure. FIGS. 7A-7B are cross-sectional views of various stages of a process for forming a portion of a semiconductor device structure, in accordance with some embodiments. In some embodiments, similar to the embodiments illustrated in FIGS. 6A-6B, portions of the catalyst layer 112 are separated from the main portion of the catalyst layer 112, as shown in FIG. 7A.

In some embodiments, first portions of the catalyst layer 112 separated from the main portion of the catalyst layer 112 form multiple particles 602 near or at the top of the carbon-containing conductive structure 132, as shown in FIG. 7A. In some embodiments, second portions of the catalyst layer 112 separated from the main portion of the catalyst layer 112 form multiple particles 702 near or at the sidewall of the carbon-containing conductive structure 132, as shown in FIG. 7A. The particles 702 are between the dielectric layer 124 and the carbon-containing conductive structure 132, as shown in FIG. 7A. The particles 702 are near the interface between the dielectric layer 124 and the carbon-containing conductive structure 132.

Afterwards, the processes similar to those illustrated in FIG. 1K are performed. As a result, the structure shown in FIG. 7B is formed, in accordance with some embodiments. Due to the planarization process, the particles 602 and the anti-reflection layer 126 are removed. In some embodiments, the particles 702 remain between the dielectric layer 124 and the carbon-containing conductive structure 132.

Figure 8:
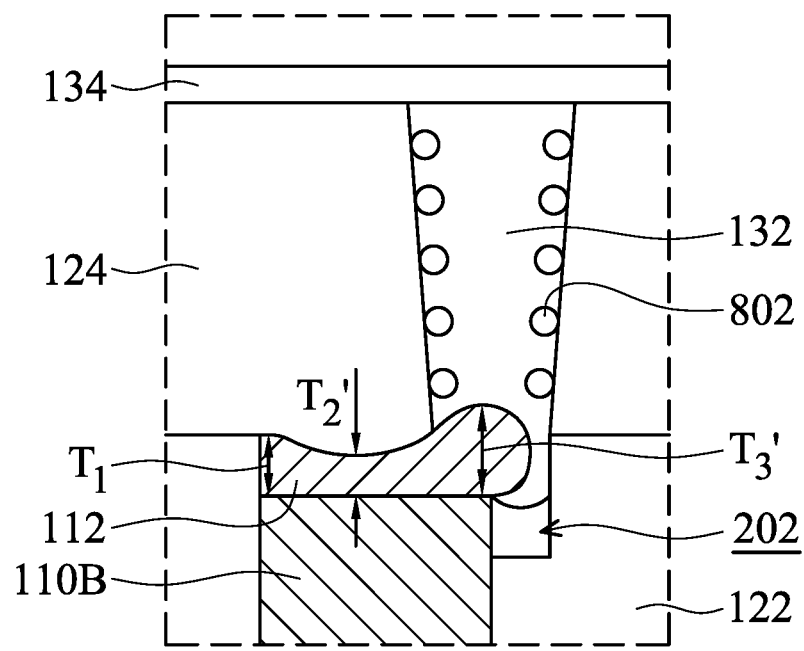
FIG. 8 is a cross-sectional view of a portion of a semiconductor device structure, in accordance with some embodiments.

Many variations and/or modifications can be made to embodiments of the disclosure. FIG. 8 is a cross-sectional view of a portion of a semiconductor device structure, in accordance with some embodiments. In some embodiments, similar to the embodiments illustrated in FIG. 5, the carbon-containing conductive structure 132 is formed. The profile and/or thickness of the catalyst layer 112 are changed after the formation of the carbon-containing conductive structure 132. In some embodiments, similar to the embodiments illustrated in FIG. 7A, portions of the catalyst layer 112 are separated from the main portion of the catalyst layer 112 and form particles 802, as shown in FIG. 7A. The particles may be between the dielectric layer 124 and the carbon-containing conductive structure 132, as shown in FIG. 8.

Figure 9:
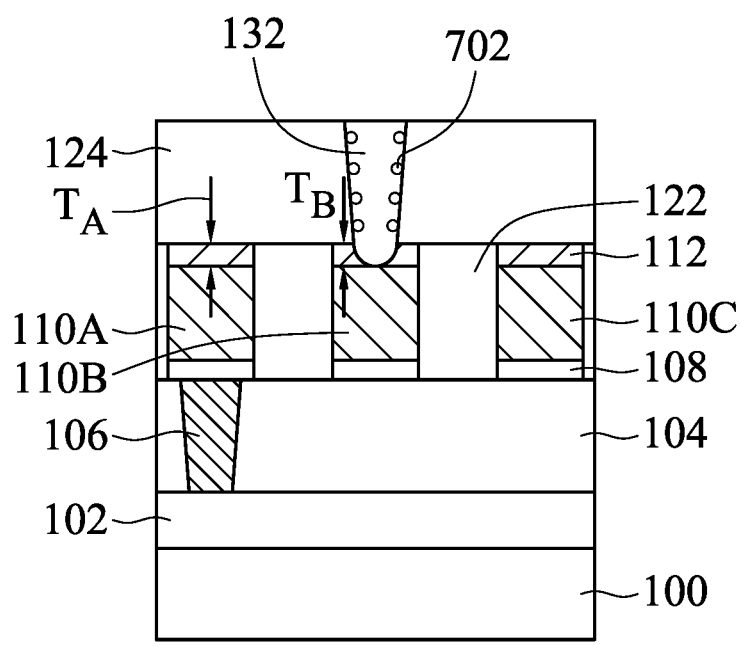
FIG. 9 is a cross-sectional view of a portion of a semiconductor device structure, in accordance with some embodiments.

Many variations and/or modifications can be made to embodiments of the disclosure. FIG. 9 is a cross-sectional view of a portion of a semiconductor device structure, in accordance with some embodiments. In some embodiments, similar to the embodiments illustrated in FIG. 7B, the carbon-containing conductive structure 132 is formed. The profile and/or thickness of the catalyst layer 112 are changed after the formation of the carbon-containing conductive structure 132.

In some embodiments, portions of the catalyst layer 112 are separated from the main portion of the catalyst layer 112 and form particles 802, as shown in FIG. 9. The particles may be between the dielectric layer 124 and the carbon-containing conductive structure 132, as shown in FIG. 9. In some embodiments, after the portions of the catalyst layer 112 are separated from the main portion of the catalyst layer 112, the carbon-containing conductive structure 132 is in direct contact with the conductive structure 110B, as shown in FIG. 9.

As shown in FIG. 9, some portions of the catalyst layer 112 are vertically between the conductive structure 110B and the carbon-containing conductive structure 132. In some embodiments, the carbon-containing conductive structure 132 is in direct contact with both of the catalyst layer 112 and the conductive structure 110B, as shown in FIG. 9.

Embodiments of the disclosure form a semiconductor device structure with a carbon-containing conductive structure. A catalyst structure is formed on a conductive structure before surrounding the conductive structure and the catalyst structure with a first dielectric layer. Afterwards, a second dielectric layer is formed to cover the first dielectric layer and the catalyst structure. The second dielectric structure is partially removed to form an opening partially exposing the catalyst structure. Afterwards, a carbon-containing conductive structure is grown on the catalyst structure. The carbon-containing conductive structure has high electrical conductivity, high thermal conductivity, and good thermal stability. The performance and reliability of the semiconductor device structure are greatly improved.

In accordance with some embodiments, a semiconductor device structure is provided. The semiconductor device structure includes a substrate and a conductive line over the substrate. The semiconductor device structure also includes a catalyst structure over the conductive line and a carbon-containing conductive via directly on the catalyst structure. The semiconductor device structure further includes a dielectric layer surrounding the carbon-containing conductive via.

In accordance with some embodiments, a semiconductor device structure is provided. The semiconductor device structure includes a substrate and a first conductive structure over the substrate. The semiconductor device structure also includes a catalyst structure over the first conductive structure and a second conductive structure over the catalyst structure. The second conductive structure has a greater atomic concentration of carbon than that of the first conductive structure. The semiconductor device structure further includes a dielectric layer surrounding the second conductive structure.

In accordance with some embodiments, a method for forming a semiconductor device structure is provided. The method includes forming a conductive layer over a substrate and forming a catalyst layer over the conductive layer. The method also includes partially removing the conductive layer and the catalyst layer. As a result, a remaining portion of the conductive layer forms a conductive line, and a remaining portion of the catalyst layer forms a catalyst structure over the conductive line. The method further includes forming a dielectric layer over the conductive line and the catalyst structure and partially removing the dielectric layer to form a via hole exposing the catalyst structure. In addition, the method includes growing a carbon-containing conductive via on the catalyst structure exposed by the via hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate;
   a conductive line over the substrate;
   a catalyst structure over the conductive line;
   a carbon-containing conductive via on the catalyst structure;
   a first dielectric layer surrounding the carbon-containing conductive via;
   a second dielectric layer between the first dielectric layer and the substrate, wherein the second dielectric layer surrounds the conductive line; and
   an enclosed hole surrounded by the carbon-containing conductive via, the conductive line, and the second dielectric layer.

2. The semiconductor device structure as claimed in claim 1, wherein the carbon-containing conductive via comprises carbon nanotubes.

3. The semiconductor device structure as claimed in claim 1, wherein the catalyst structure comprises Ti, Fe, Co, Ni, or a combination thereof.

4. The semiconductor device structure as claimed in claim 1, wherein the carbon-containing conductive via has a convex bottom surface facing the enclosed hole.

5. The semiconductor device structure as claimed in claim 1, wherein the carbon-containing conductive via is directly on a top surface and a side surface of the catalyst structure.

6. The semiconductor device structure as claimed in claim 1, wherein the carbon-containing conductive via is physically separated from the conductive line.

7. The semiconductor device structure as claimed in claim 1, wherein the catalyst structure has a first region and a second region beside the first region, the carbon-containing conductive via is formed on the first region, and the first region is thicker than the second region.

8. The semiconductor device structure as claimed in claim 1, wherein the catalyst structure has a first region and a second region beside the first region, the carbon-containing conductive via is formed on the first region, and the first region is thinner than the second region.

9. The semiconductor device structure as claimed in claim 1, further comprising a plurality of catalyst particles between the first dielectric layer and the carbon-containing conductive via.

10. The semiconductor device structure as claimed in claim 1, wherein a topmost surface of the catalyst structure is closer to the conductive line than a top of the carbon-containing conductive via, and the top of the carbon-containing conductive via is wider than a bottom of the carbon-containing conductive via.

11. The semiconductor device structure as claimed in claim 1, wherein the carbon-containing conductive via has a curved portion extending into the catalyst structure.

12. A semiconductor device structure, comprising:
    a substrate;
    a first conductive structure over the substrate;
    a catalyst structure over the first conductive structure;
    a second conductive structure over the catalyst structure, wherein the second conductive structure has a greater atomic concentration of carbon than that of the first conductive structure;
    a dielectric layer surrounding the second conductive structure; and
    an enclosed hole surrounded by the second conductive structure and the first conductive structure.

13. The semiconductor device structure as claimed in claim 12, wherein the second conductive structure has a higher electrical conductivity than that of the first conductive structure, and the second conductive structure has a higher thermal conductivity than that of the first conductive structure.

14. The semiconductor device structure as claimed in claim 12, further comprising at least one catalyst particle near an interface between the second conductive structure and the dielectric layer.

15. The semiconductor device structure as claimed in claim 12, wherein the second conductive structure is in direct contact with the first conductive structure and the catalyst structure.

16. The semiconductor device structure as claimed in claim 12, wherein a topmost surface of the catalyst structure is closer to the first conductive structure than a topmost surface of the second conductive structure.

17. A method for forming a semiconductor device structure, comprising:
- forming a conductive layer over a substrate;
- forming a catalyst layer over the conductive layer;
- partially removing the conductive layer and the catalyst layer such that a remaining portion of the conductive layer forms a conductive line, and a remaining portion of the catalyst layer forms a catalyst structure over the conductive line;
- forming a first dielectric layer over the conductive line and the catalyst structure to cover the catalyst structure;
- partially removing the first dielectric layer to form a via hole exposing a portion of the catalyst structure that is previously covered by the first dielectric layer; and
- growing a carbon-containing conductive via on the catalyst structure exposed by the via hole, wherein the via hole exposes a side surface of the catalyst structure and a side surface of the conductive line before the growth of the carbon-containing conductive via.

18. The method for forming a semiconductor device structure as claimed in claim 17, further comprising forming a second dielectric layer to surround the conductive line and the catalyst structure before the formation of the first dielectric layer.

19. The method for forming a semiconductor device structure as claimed in claim 17, wherein the carbon-containing conductive via is also grown on the side surface of the catalyst structure, and the carbon-containing conductive via is substantially not grown on the side surface of the conductive line.

20. The semiconductor device structure as claimed in claim 17, wherein a topmost surface of the catalyst structure is substantially level with a bottommost surface of the first dielectric layer.

* * * * *